United States Patent [19]

Ebesyu

[11] Patent Number: 4,928,026
[45] Date of Patent: May 22, 1990

[54] DIGITAL PHASE COMPARING CIRCUIT

[75] Inventor: Hidetaka Ebesyu, Tokyo, Japan

[73] Assignee: Fujitsu Limited, Kawasaki, Japan

[21] Appl. No.: 288,378

[22] Filed: Dec. 22, 1988

[30] Foreign Application Priority Data

Dec. 24, 1987 [JP] Japan ................................ 62-325322

[51] Int. Cl.$^5$ ........................ H03K 19/00; H03K 5/00
[52] U.S. Cl. .................................... 307/479; 307/262;
307/511; 307/514; 328/133; 328/109
[58] Field of Search ............... 307/479, 510, 511, 514,
307/262; 328/133, 209, 155, 55

[56] References Cited

U.S. PATENT DOCUMENTS

| 3,610,954 | 10/1971 | Treadway | 328/133 |
| 4,291,274 | 9/1981 | Suzuki et al. | 328/133 |
| 4,739,278 | 4/1988 | Des Brisay, Jr. et al. | 328/133 |
| 4,751,469 | 6/1988 | Nakagawa et al. | 328/133 |
| 4,764,737 | 8/1988 | Kaatz | 328/133 |

FOREIGN PATENT DOCUMENTS 0011128 10/1979 European Pat. Off. .
1462408 6/1974 United Kingdom .

Primary Examiner—Stanley D. Miller
Assistant Examiner—Richard Roseen
Attorney, Agent, or Firm—Armstrong, Nikaido, Marmelstein, Kubovcik & Murray

[57] ABSTRACT

A digital phase comparing circuit includes a pair of circuits for detecting each rise of a pair of input signals, respectivaly, and outputting a pair of detection signals, a pair of flip-flops which are set in response to the corresponding detection signal, respectively, and a logic gate circuit responsive to a pair of outputs from the pair of flip-flops and resetting the pair of flip-flops when the output conincide with each other. Each output of the flip-flops has a pulse width corresponding to a phase difference between the pair of input signals. It is thus possible to avoid an erroneous operation in the subsequent circuit, to facilitate the layout of the circuit, and to simplify the process thereof.

5 Claims, 9 Drawing Sheets

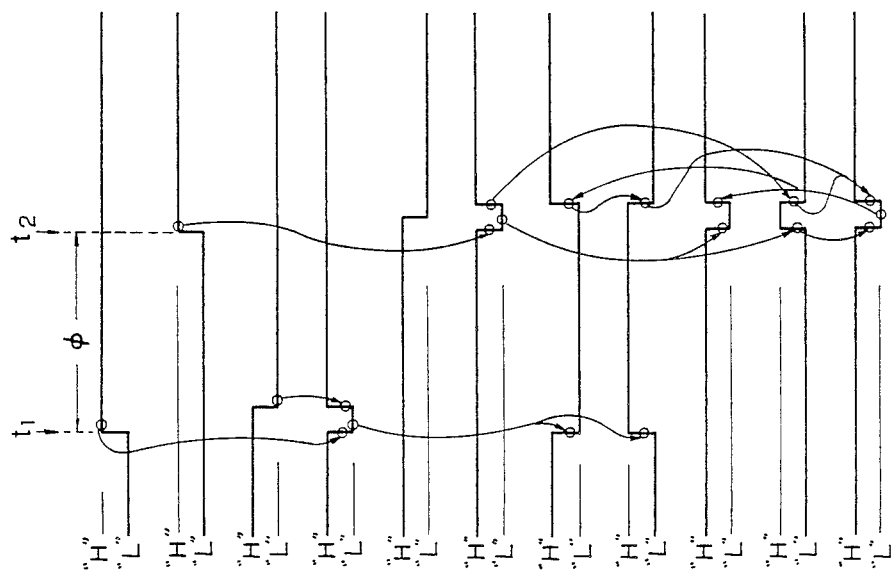
Fig.4a IN. SIGNAL S1
Fig.4b IN. SIGNAL S2
Fig.4c OUTPUT Q OF FF1
Fig.4d SIGNAL S3
Fig.4e OUTPUT Q OF FF2
Fig.4f SIGNAL S4
Fig.4g OUT. SIGNAL S5
Fig.4h OUT. SIGNAL S6
Fig.4i OUT. SIGNAL S7
Fig.4j OUT. SIGNAL S8
Fig.4k SIGNAL S9

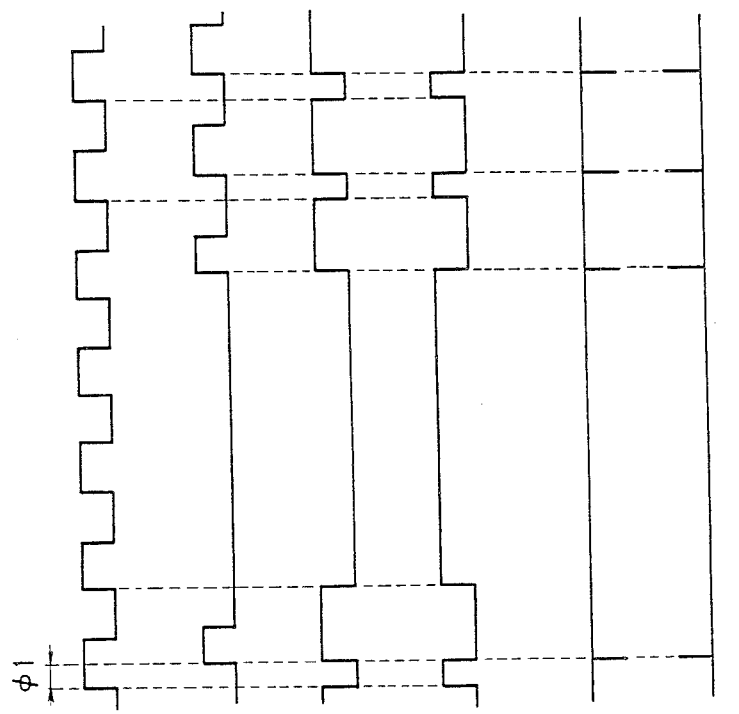

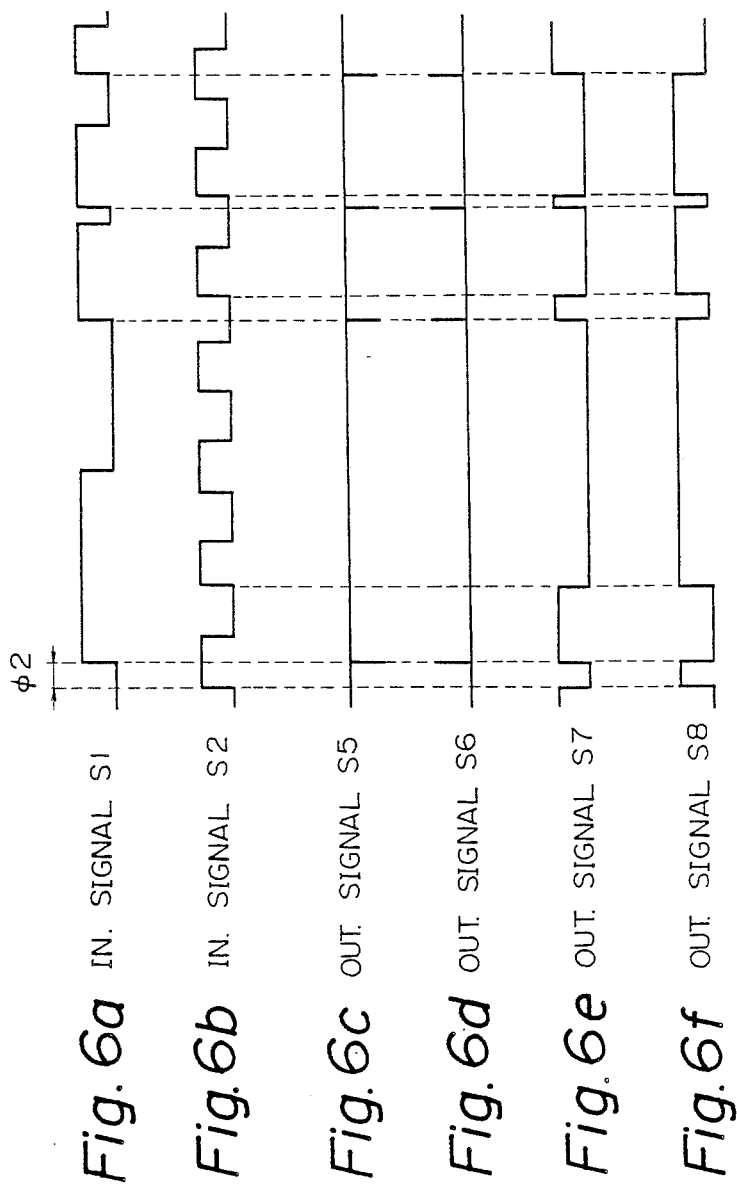

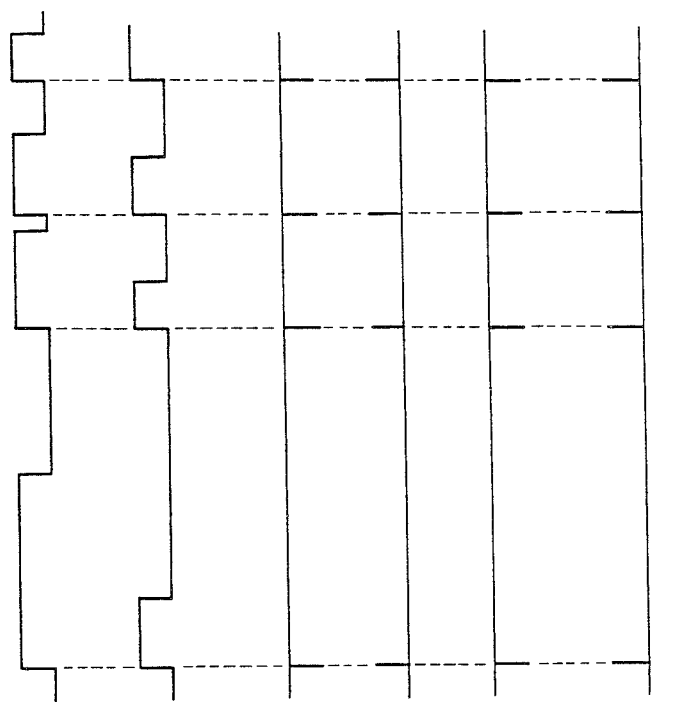

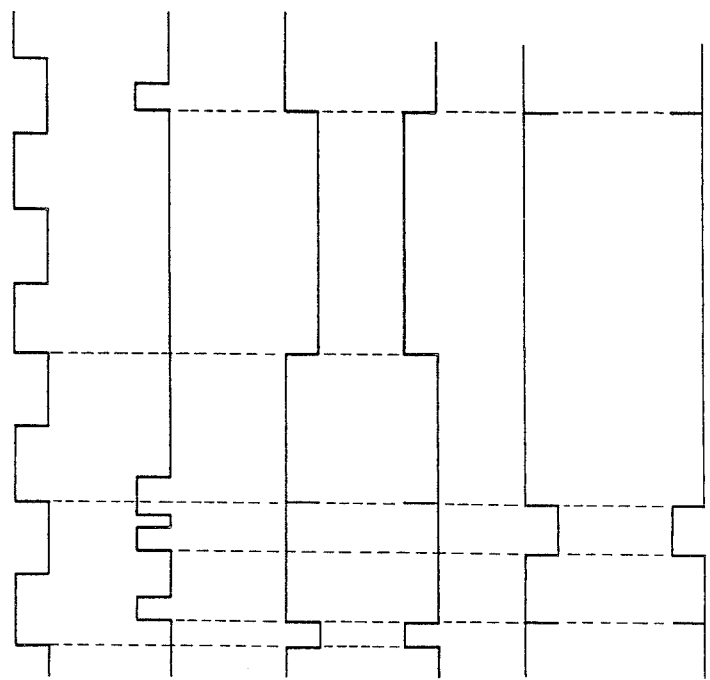
Fig.8a IN. SIGNAL S1
Fig.8b IN. SIGNAL S2
Fig.8c OUT. SIGNAL S5
Fig.8d OUT. SIGNAL S6
Fig.8e OUT. SIGNAL S7
Fig.8f OUT. SIGNAL S8

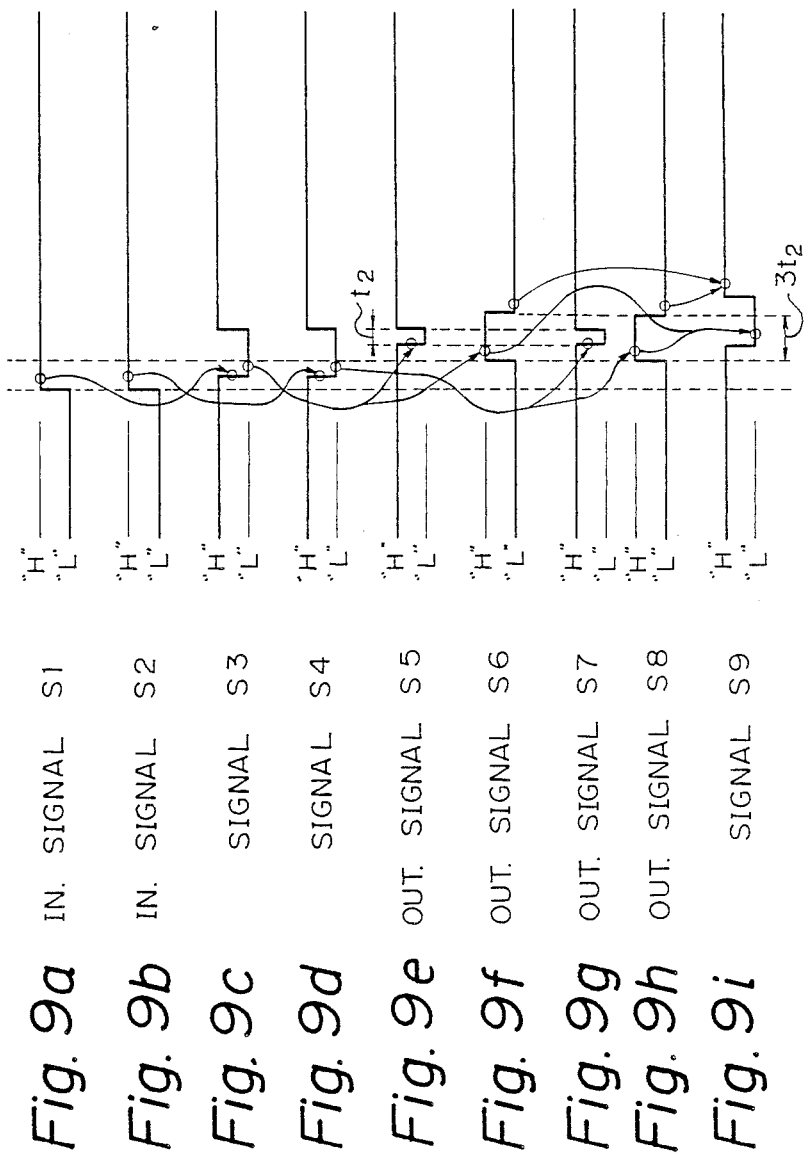

DIGITAL PHASE COMPARING CIRCUIT

BACKGROUND OF THE INVENTION

1. Field of the Invention

The present invention relates to a digital phase comparing circuit. The circuit according to the present invention can be utilized in various field, for example, in an apparatus employing a phase locked loop (PLL) circuit, e.g., acoustic equipment such as a stereo, a television set and the like, a frequency synthesizer, or telecommunication equipment.

2. Description of the Related Art

A digital phase comparing circuit is generally comprised of a plurality of logic gates constituted by a plurality of transistors formed and integrated on a semiconductor substrate, and constituted such that it receives two digital input signals, and based on a phase comparison thereof, outputs an output signal having a pulse width corresponding to the phase difference between the digital input signals.

An example of such a circuit is disclosed, for example, by USP 3,610,954, wherein the circuit is constituted by a plurality of types of NAND gates, i.e., two-input type, three-input type, and four-input type NAND gates, and the logical level of the pulse signal output based on the phase comparison is fixed to either the "L" level or "H" level.

In practical application, however, it is assumed that an "H" level (or "L" level) signal is more convenient than an "L" level (or "H" level) signal as the input signal of a circuit following the phase comparing circuit. In this case, to adapt the phase comparing circuit to the following circuit, an inverter for inverting the "L" level (or "H" level) signal to the "H" level (or "L" level) signal must be added in parallel to the output end. This leads to an increase in the region of the semiconductor substrate needed for the formation of the transistors constituting the inverter, and thus is not preferable from the viewpoint of obtaining a high degree of integration. Also, since the above circuit employs a plurality of types of NAND gates, a plurality of gate circuit patterns corresponding to the types of NAND gates must be prepared, and accordingly, the patterning process during the production of the circuit becomes very complicated and unpreferable.

SUMMARY OF THE INVENTION

An object of the present invention is to provide a digital phase comparing circuit which is more convenient for a following circuit, so that the following circuit can utilize both the "H" level and "L" level signals, while simplifying the process and facilitating a high degree of integration thereof.

The above object is obtained by providing a digital phase comparing circuit including: first and second input terminals receiving first and second input signals, respectively; a level change detecting circuit for detecting changes in levels of the first and second input terminals, respectively, and outputting first and second detection signals indicating the changes in levels; and a flip-flop circuit operatively connected to the level change detecting circuit, being set in response to an input of one of the first and second detection signals and being reset in response to a following input of one of the first and second detection signals, thereby outputting a pair of output signals having a pulse width corresponding to a phase difference between the first and second input signals.

BRIEF DESCRIPTION OF THE DRAWINGS

Other objects and features of the present invention will be described hereinafter in detail by way of the preferred embodiments with reference to the accompanying drawings, in which:

FIGS. 4a to 4k are timing charts of signals for explaining an example of the operation of the circuit shown in FIG. 3;

FIGS. 5a to 5f are timing charts of signals, showing a first example of the operation of the circuit shown in FIG. 3;

FIGS. 6a to 6f are timing charts of signals, showing a second example of the operation of the circuit shown in FIG. 3;

FIGS. 7a to 7f are timing charts of signals showing a third example of the operation of the circuit shown in FIG. 3;

FIGS. 8a to 8f are timing charts of signals, showing a fourth example of the operation of the circuit shown in FIG. 3; and FIGS. 9a to 9i are timing charts of signals for explaining the third example of the operation of the circuit shown in FIG. 3.

DESCRIPTION OF THE PREFERRED EMBODIMENTS

For a better understanding of the preferred embodiments, the problems of the prior art will now be explained with reference to FIG. 1.

Figure 1:
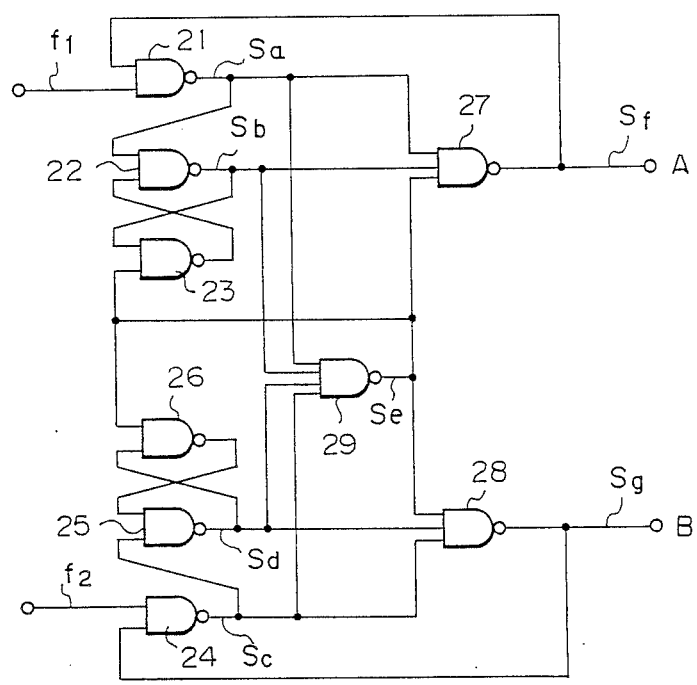
FIG. 1 is a circuit diagram illustrating a constitution of an example of the prior art digital phase comparing circuit.

FIGS. 1 shows a circuit constitution of an example of the prior art digital phase comparing circuit disclosed in USP 3,610,954.

The circuit is constituted by a two-input NAND gate 21 responding to a digital input signal $f_1$ and a phase-comparison output signal Sf; a pair of two-input NAND gates 22 and 23 constituting a flip-flop responding to the output Sa of the NAND gate 21 and a reset signal Se; a two-input NAND gate 24 responding to another digital input signal $f_2$ and another phase-comparison output signal Sg; a pair of two-input NAND gates 25 and 26 constituting a flip-flop responding to the output Sc of the NAND gate 24 and the reset signal Se; a three-input NAND gate 27 responding to the output Sa of the NAND gate 21, the output Sb of the flip-flop 22, 23, and the reset signal Se, and outputting the phase-comparison output signal Sf; a three-input NAND gate 28 responding to the output Sc of the NAND gate 24, the output Sd of the flip-flop 25, 26, and the reset signal Se, and outputting the phase-comparison output signal Sg; and a four-input NAND gate 29 responding to the signals Sa, Sb, Sc, and Sd, and outputting the reset signal Se.

The circuit of FIG. 1 carries out the phase-comparison operation when the digital input signals $f_1$ and $f_2$ are made "L" level. For example, where the input signal $f_1$ leads in phase compared with the input signal $f_2$, a signal having a pulse width corresponding to the phase difference between the input signals is output to an output terminal A as the phase-comparison output Sf. Conversely, where the input signal $f_1$ lags in phase compared with the input signal $f_2$, a signal having a pulse width corresponding to the phase difference is output to an output terminal B as the phase-comparison output Sg. In this case, the output signal appearing at each of the terminals A and B as the phase-comparison output is a signal in the form of an "L" level pulse.

In some applications, however, it is assumed that an "H" level pulse signal would be more convenient for a circuit following the circuit of FIG. 1. Accordingly, two inverters must be added in parallel to the output terminals A and B, respectively, and an "H" level pulse signal produced. Assuming that each of the inverters is constituted by two transistors having a complementary metal oxide semiconductor structure, four transistors must be newly added to the circuit. But, since this means that the region of the semiconductor substrate, required for the formation of the four transistors is increased, it is disadvantageous to the high degree of integration of the circuit.

Also, since three types of NAND gates are employed in the circuit of FIG. 1, three types of gate circuit patterns must be prepared during the production of the circuit, and thus the patterning process becomes complicated.

Figure 2:
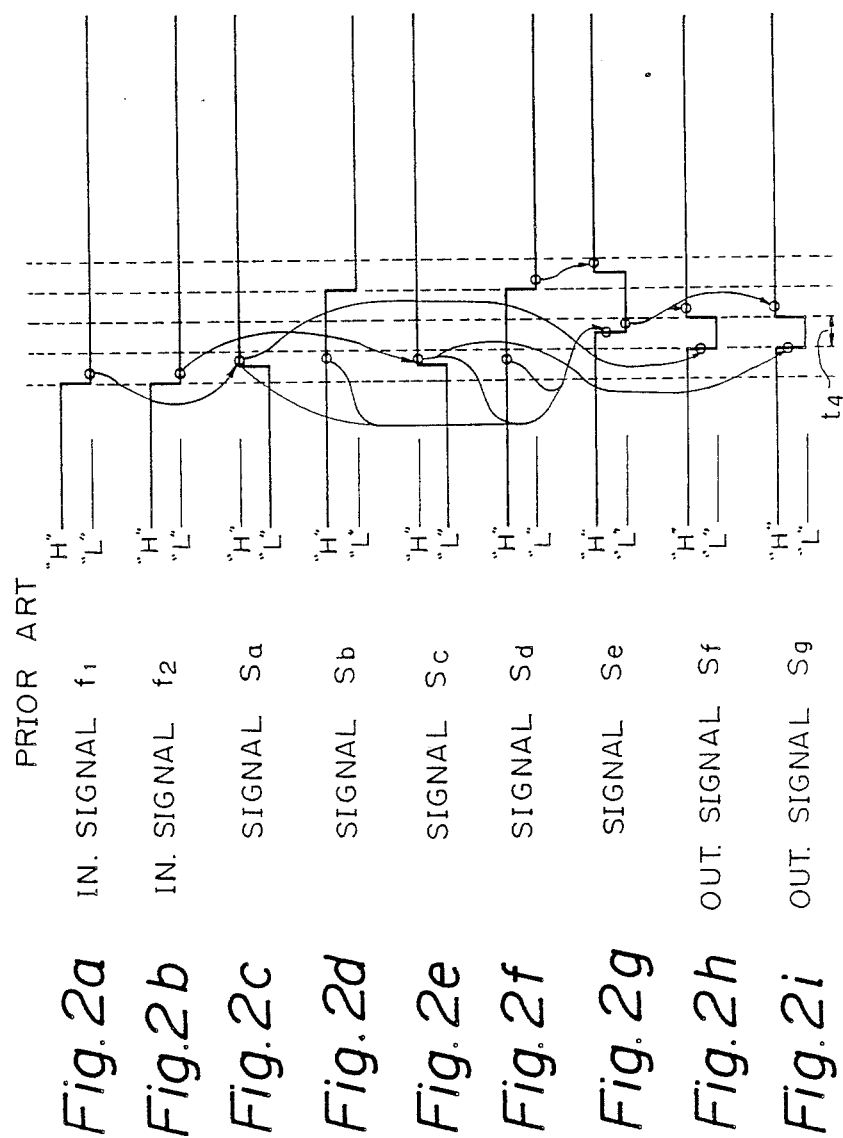
FIGS. 2a to 2i are timing charts of signals for explaining an example of the operation of the circuit shown in FIG. 1.

In the circuit constitution of FIG. 1, where the input signal $f_1$ is synchronized in phase with the input signal $f_2$, there is no phase difference therebetween, and accordingly, in logical terms, no pulse signals appears at the terminals A and B. In actual operation, however, a transient pulse signal such as a spike wave appears at each terminal, as shown in FIGS. 2h and 2i.

FIGS. 2a to 2i show the operational timing of each signal where the input signals $f_1$ and $f_2$ are synchronized in phase.

Referring to FIGS. 1 and 2a to 2i, when the input signal $f_1$ is made "L" level, the signal Sa is made "H" level and the output signal Sf is then made "L" level. Also, when the input signal $f_2$ is made "L" level, the signal Sc is made "H" level and the output signal Sg is then made "L" level. When the signals Sa and Sc are made "L" level, the output signal Se of the NAND gate 29 is made "L" level, because the signals Sb and Sd are "L" level. Upon receipt of the change in level of the signal Se, the output signals Sf and Sg are made "H" level.

Namely, a transient pulse signal (Sf, Sg) appears at each of the terminals A and B due to the operational delay of the four-input NAND gate 29, even if the input signals $f_1$ and $f_2$ are synchronized in phase. Where the pulse width $t_4$ of the transient pulse signal becomes larger than a permissible value, this may have an adverse affect on the following circuit. Therefore, preferably, the pulse width is as small as possible.

Next, a preferred embodiment of the present invention will be described in detail with reference to FIGS. 3 to 9i.

Figure 3:
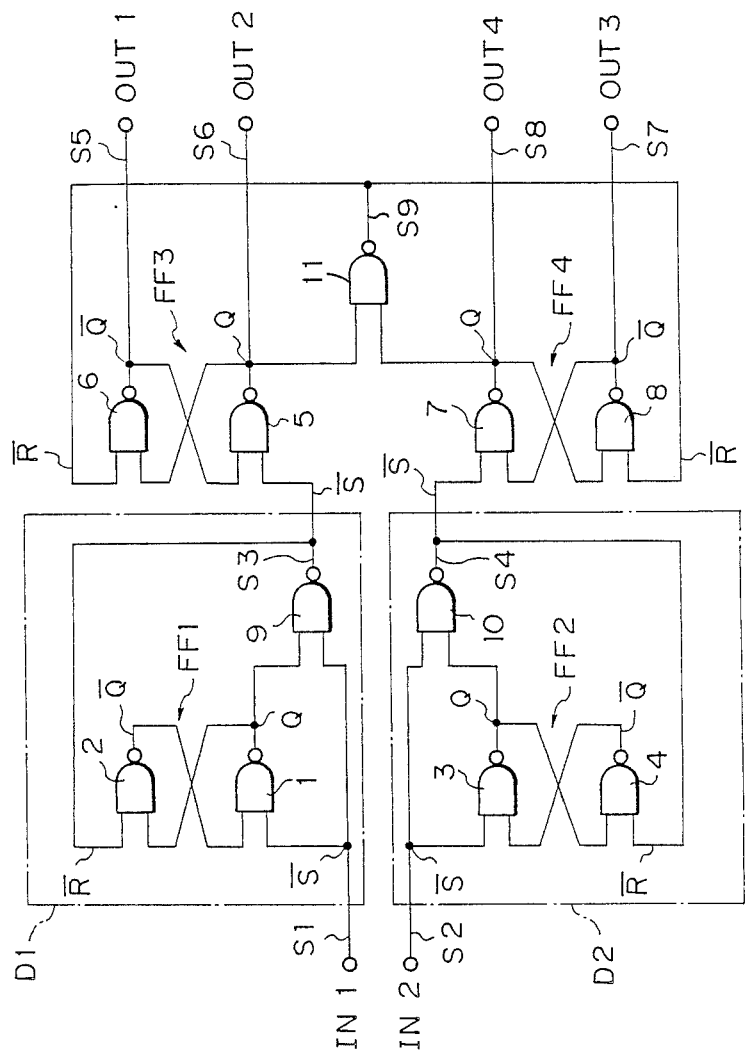
FIG. 3 is a circuit diagram illustrating a constitution of the digital phase comparing circuit as an embodiment of the present invention.

FIG. 3 illustrates a circuit constitution of the digital phase comparing circuit as an embodiment of the present invention. The circuit of the present embodiment is constituted by only two-input NAND gates.

In FIG. 3, two NAND gates 1 and 2 constitute an RS type flip-flop FF1; two NAND gates 3 and 4, an RS type flip-flop FF2; two NAND gates 5 and 6, and RS type flip-flop FF3; and two NAND gates 7 and 8, an RS type flip-flop FF4. Note, references $\overline{R}$, $\overline{S}$, Q and $\overline{Q}$ given to each of the flip-flop indicate a reset input, a set input, a positive logic output, and a negative logic output, respectively. For example, referring to the flip-flop FF1, one input end of the NAND gate 1 receives the set input $\overline{S}$ and the other input end thereof receives the output $\overline{Q}$ of the NAND gate 2, and one input end of the NAND gate 2 receives the reset input $\overline{R}$ and the other input end thereof receives the output Q of the NAND gate 1. The other flip-flops FF2, FF3, and FF4 are connected in the same manner as the flip-flop FF1.

An input terminal IN1 is connected to the set input end $\overline{S}$ of the flip-flop FF1 and one input end of an NAND gate 9. The other input end of the NAND gate 9 is connected to the output end Q of the flip-flop FF1, and the output end thereof is connected to the reset input and $\overline{R}$ of the flip-flop FF1. The NAND gate 9 constitutes a rise detecting circuit D1 together with the flip-flop FF1. Namely, the rise detecting circuit D1 has the function of detecting a time of the rise of the digital input signal S1 applied to the input terminal IN1. The output signal of the rise detecting circuit D1 is hereinafter indicated by reference S3.

In the same way, an input terminal IN2 is connected to the set input end $\overline{S}$ of the flip-flop FF2 and one input end of an NAND gate 10. The other input end of the NAND gate 10 is connected to the output end Q of the flip-flop FF2, and the output end thereof is connected to the reset input end $\overline{R}$ of the flip-flop FF2. The NAND gate 10 constitutes a rise detecting circuit D2 together with the flip-flop FF2. The rise detecting circuit D2 also has the function of detecting a time of the rise of a digital input signal S2 applied to the input terminal IN2. The output signal of the rise detecting circuit D2 is hereinafter indicated by reference S4.

The output end of the rise detecting circuit D1 is connected to a set input end $\overline{S}$ of the flip-flop FF3, and the output end of the rise detecting circuit D2 is connected to a set input end $\overline{S0}$ of the flip-flop FF4. One output end $\overline{Q}$ of the flip-flop FF3 is connected to an output terminal OUT1, and the other output end Q thereof is connected to an output terminal OUT2 and one input end of an NAND gate 11. IN the same way, one output end $\overline{Q0}$ of the flip-flop FF4 is connected to an output terminal OUT3, and the other output end Q thereof is connected to an output terminal OUT4 and the other input gate 11 is connected to each reset input end $\overline{R}$ of the flip-flops FF3 and FF4. The output signals appearing at the output terminals OUT1, OUT2, OUT3, and OUT4 are hereinafter indicated by references S5, S6, S7, and S8, respectively. Also, the output signal of the NAND gate 11 is indicated by reference S9.

Next, an example of the operation of the circuit shown in FIG. 3 will be explained with reference to the timing charts of signals shown in FIGS. 4a to 4k. Note, it is assumed that the input signal S1 leads by the phase difference $\phi$, compared with the input signal S2, and that the flip-flop FF1 and FF2 are reset When the input signal S1 is applied to the input terminal IN1 and made "H" level at a time $t_1$ (see FIG. 4a), the output S3 of the rise detecting circuit D1 is made "L" level (see FIG. 4d). Upon receipt of the change in level, the negative logic output $\overline{Q}$ (signal S5) of the flip-flop FF3 is made "L" level (see FIG. 4g), and the positive logic output Q (signal S6) thereof is made "H" level (see FIG. 4h). Also, in the rise detecting circuit D1, the positive logic output Q of the flip-flop FF1 is made "L" level, after a slight delayed from the time $t_1$ due to a delay in the operation of the NAND gates 1, 2, and 9 (see FIG. 4c). At this time, the output S3 of the rise detecting circuit D1 is made "H" level.

In the same way, when the input signal S2 is applied to the input terminal IN2 and made "H" level at a time $t_2$ (see FIG. 4b), the output S4 of the rise detecting circuit D2 is made "L" level (see FIG. 4f). Upon receipt of the change in level, the negative logic output $\overline{Q}$ (signal S7) of the flip-flop FF4 is made "L" level (see FIG. 4i), and the positive logic output Q (signal S8) thereof is made "H" level (see FIG. 4j). Also, in the rise detecting circuit D2, the positive logic output Q of the flip-flop FF2 is made "L" level, after a slight delayed from the time $t_2$ due to a delay in the operation of the NAND gates 3, 4 and 10 (see FIG. 4e). At this time, the output S4 of the rise detecting circuit D2 is made "H" level.

When the output signal S8 of the flip-flop FF4 is made "H" level at the time $t_2$, the output signal S9 of the NAND gate 11 is made "L" level (see FIG. 4k), because the output signal S6 of the flip-flop FF3 is now "H" level. Upon receipt of the change in level, the flip-flops FF3 and FF4 are reset, and as a result, the output signal S5 of the flip-flop FF3 is made "H" level, and the output signal S7 of the flip-flop FF4 is made "H" level.

When the output signal S4 of the rise detecting circuit D2 is then made "H" level, the output Q (signal S8) of the flip-flop FF4 is made "L" level (see FIG. 4j). When either the output signal S6 of the flip-flop FF3 or the output signal S8 of the flip-flop FF4 is made "L" level, the output signal S9 of the NAND gate 11 is made "H" level, so that the reset of the flip-flops FF3 and FF4 is cancelled. Note, for the flip-flop FF3, when the output S9 of the NAND gate 11 is "L" level, the output Q (signal S6) is made "L" level due to the delay at the gates, because the set input (signal S3) is "H" level.

FIGS. 4a to 4k show the operational timing of each signal in the circuit of FIG. 3 in detail, whereby the time $t_2$ is different from the time of the rise of the output signal S5 of the flip-flop FF3 and of the fall of the output signal S6 thereof. In actual operation, however, a period from the time $t_2$ to the rise of the signal S5 and a period from the time $t_2$ to the fall of signal S6 are very short, and thus can be disregarded. Therefore, a period during which the output signal S5 of the flip-flop FF3 is "L" level and the output signal S6 thereof is "H" level indicates a period corresponding to the phase difference $\phi$ between the input signals S1 and S2. Also, the output signals S7 and S8 of the flip-flop FF4 are actually output in the form of a spike wave or a hazard, although these signals have the form of a rectangular wave in FIGS. 4i and 4j.

The circuit of FIG. 3 is constituted such that it can output the phase-comparison output signal having a pulse width corresponding to the phase difference between the input signals in the form of both of "H" level and "L" level, and thus is conveniently utilized at the following circuit. Also, as the circuit is constituted only by two-input NAND gates, only one type of gate circuit pattern need be prepared for the production of the circuit, which greatly simplifies the process and enhances a high degree of integration.

Although, in the above example, the operational mode wherein the input signal S1 leads in phase compared with the input signal S2 is described, the present invention is not restricted thereto, and other operational modes of a phase lead or phase lag can be used, as described hereinafter with reference to FIGS. 5a to 8f.

FIGS. 5a to 5f show the operational timing of each signal where the input signal S1 leads in phase compared with the input signal S2, i.e., the operational timing illustrated in FIGS. 4a to 4k, and thus an explanation thereof will be omitted. Note, in this case, the phase difference $\phi1$ between the input signals S1 and S2 is represented by the outputs Q and $\overline{Q}$ of the flip-flop FF3 and appears at the output terminals OUT1 and OUT2.

Accordingly, where an "H" level signal would be more convenient as the input signal for a circuit at the next stage and connected to the present digital phase comparing circuit, the output signal S6 appearing at the output terminal OUT2 is preferably utilized. Conversely, where an "L" level signal would be more convenient, the output signal S5 appearing at the output terminal OUT1 is preferably utilized.

FIGS. 6a to 6f show the operational timing of each signal where the input signal S1 lags in phase compared with the input signal S2. Since the operational mode is easily deduced from that shown in FIGS. 5a to 5f, based on the symmetrical constitution of the present circuit, an explanation thereof will be omitted. Note, in this case, the phase difference $\phi2$ between the input signals S1 and S2 is represented by the outputs Q and $\overline{Q}$ of the flip-flop FF4 and appears at the output terminals OUT3 and OUT4. Also, since the manner of utilization of the output signals S7 and S8 is the same as that shown in FIGS. 5a to 5f, an explanation thereof will be omitted.

FIGS. 7a to 7f show the operational timing of each signal where the input signal S1 is synchronized in phase with the input signal S2. Since the operational mode is easily deduced from that shown in FIGS. 5a to 5f or FIGS. 6a to 6f, an explanation thereof will be omitted. Note, in this case, since there is no phase difference between the input signals S1 and S2, a transient signal such as "a spike wave" appears at each of the output terminals OUT1 to OUT4, as shown in FIGS. 7c to 7f, but the duration of appearance of the transient signal is very short, and thus can be disregarded in the actual operation of the present circuit.

FIGS. 8a to 8f show the operational timing of each signal where both of a phase lead and a phase lag exist between the input signals S1 and S2. Since the operational mode is easily deduced from that in the above described cases, an explanation thereof will be omitted.

FIGS. 9a to 9i show the operational timing illustrated in FIGS. 7a to 7f in more detail, as a comparison with FIGS. 2a to 2i.

According to the constitution shown in FIG. 3, when the input signals S1 and S2 are synchronized in phase, transient pulse signals S5, S6, S7, and S8 appear at the terminals OUT1, OUT2, OUT3, and OUT4, respectively, as shown in FIGS. 9e to 9h. In this case, the transient pulse S5 (S7) is generated due to the operational delay of the two-input NAND gate 11, and the transient pulse S6 (S8) is generated due to the operational delay of the three two-input NAND gates 11, 6, and 5 (11, 8, and 7). Taking into consideration the constitutions of the two-input and four-input NAND gates, the operational delay in the former is much shorter than that in the latter, and therefore, since the pulse width $t_2$ of the transient pulses S5 and S7 becomes shorter than that ($t_4$) of the prior art transient pulse, it is possible to reduce any adverse affect on the following circuit.

Although the present invention has been disclosed and described by way of only one embodiment, it is apparent to those skilled in the art that other embodiments and modifications of the present invention are possible without departing from the spirit of essential features thereof.

I claim:

1. A digital phase comparing circuit, comprising:
   first and second input terminals receiving first and second input signals, respectively;
   a first rise detecting circuit for detecting a rise of said first input signal and outputting a first detection signal;
   a second rise detecting circuit for detecting a rise of said second input signal and outputting a second detection signal;
   a first flip-flop, operatively connected to said first rise detecting circuit, being set in response to said first detection signal and being reset in response to a reset signal;
   a second flip-flop, operatively connected to said second rise detecting circuit, being set in response to said second detection signal and being reset in response to said reset signal; and
   a logical state circuit responsive to an output of said first flip-flop and an output of said second flip-flop and, when the outputs of said first and second flip-flops coincide with each other, outputting said reset signal, wherein each output of said first and second flip-flops has a pulse width corresponding to a phase difference between said first and second input signals.

2. The digital phase comparing circuit of claim 1, wherein each of said first and second rise detecting circuits comprises:
   a flip-flop constituted by two two-input NAND gates which are cross coupled, each of said rise detecting circuit flip-flops being set in response to a corresponding one of said first and second input signals and being reset in response to a corresponding one of said first and second detection signals, and
   a two-input NAND gate outputting said corresponding one of the first and second detection signals in response to said corresponding one of the first and second input signals and a positive logic output of said rise detecting circuit flip-flop.

3. The digital phase comparing circuit of claim 2, wherein said first and second flip-flops comprise two two-input NAND gates which are cross coupled, respectively, and said logical gate circuit comprises a two-input NAND gate outputting said reset signal in response to each of positive logic outputs of said flip-flops, each of said first and second flip-flops responding to said corresponding one of the first and second detection signals and said reset signal and outputting a pair of output signals.

4. The digital phase comparing circuit of claim 3, wherein said pair of output signals each have an opposite logical level and have a pulse width corresponding to a phase difference between said first and second input signals.

5. A digital phase comparing circuit, comprising:
   first and second input terminals receiving first and second input signals, respectively;
   a first rise detecting circuit for detecting a time of a rise of said first input signal and outputting a first detection signal, said first rise detecting circuit including a flip-flop having two two-input NAND gates which are cross coupled and being set in response to a corresponding input signal and being reset in response to the corresponding detection signal, and a two-input NAND gate outputting said corresponding detection signal in response to the corresponding input signal and a positive logic output of said flip-flop;
   a second rise detecting circuit for detecting a time of a rise of said second input signal and outputting a second detection signal input signal and outputting a second detection signal, said second rise detecting circuit including a flip-flop having two two-input NAND gates which are cross coupled and being set in response to a corresponding input signal and being reset in response to the corresponding detection signal, and a two-input NAND gate outputting said corresponding detection signal in response to the corresponding input signal and a positive logic output of said flip-flop; and
   a flip-flop circuit operatively connected to said first and second rise detecting circuits, being set in response to one input of said first and second detection signals and being reset in response to a subsequent input of said first and second detection signals, thereby simultaneously outputting a pair of output signals, each having an opposite logical level and having a pulse width corresponding to a phase difference between said first and second input signals.

* * * * *

UNITED STATES PATENT AND TRADEMARK OFFICE
CERTIFICATE OF CORRECTION

PATENT NO. : 4,928,026
DATED : May 22, 1990
INVENTOR(S) : Hidetaka Edesyu, et al It is certified that error appears in the above-indentified patent and that said Letters Patent is hereby corrected as shown below:

Column 7, line 21, "state" should read -- gate --.

Signed and Sealed this

Eighth Day of June, 1993

Attest:

MICHAEL K. KIRK

Attesting Officer

Acting Commissioner of Patents and Trademarks